(12) United States Patent
Ide et al.

(10) Patent No.: US 7,724,481 B2
(45) Date of Patent: May 25, 2010

(54) MAGNETIC SENSING ELEMENT INCLUDING FREE MAGNETIC LAYER OR PINNED MAGNETIC LAYER HAVING TWO SUBLAYERS THAT ARE COMPOSED OF DIFFERENT COMN-BASED HEUSLER ALLOYS

(75) Inventors: Yosuke Ide, Niigata-ken (JP);
Masamichi Saito, Niigata-ken (JP);
Masahiko Ishizone, Niigata-ken (JP);
Kazumasa Nishimura, Niigata-ken (JP);
Naoya Hasegawa, Niigata-ken (JP)

(73) Assignee: TDK Corporation, Tokyo (JP)

( * ) Notice: Subject to any disclaimer, the term of this patent is extended or adjusted under 35 U.S.C. 154(b) by 843 days.

(21) Appl. No.: 11/504,147

(22) Filed: Aug. 15, 2006

(65) Prior Publication Data
US 2007/0048551 A1     Mar. 1, 2007

(30) Foreign Application Priority Data
Aug. 24, 2005     (JP)     ............... 2005-242558

(51) Int. Cl.
G11B 5/39     (2006.01)
H01L 43/08    (2006.01)
G01R 33/09    (2006.01)
(52) U.S. Cl. ............... 360/324.12; 360/324.11
(58) Field of Classification Search ...... 360/324–324.2, 360/811.2, 812
See application file for complete search history.

(56) References Cited

U.S. PATENT DOCUMENTS 7,158,354 B2 * 1/2007 Saito et al. ............. 360/324.12
7,466,525 B2 * 12/2008 Hasegawa et al. ...... 360/324.12
7,499,249 B2 * 3/2009 Ide et al. ................ 360/324.12
2003/0137785 A1 7/2003 Saito
2004/0257714 A1 12/2004 Takahashi et al.
2005/0074634 A1 * 4/2005 Hasegawa et al. ........ 428/694 T (Continued)

FOREIGN PATENT DOCUMENTS

JP     2003-218428     7/2003

(Continued)

OTHER PUBLICATIONS

Paudel et al. "Magnetic and Transport Properties of Co2MnSnxSb1-x Heusler Alloys," published Jan. 15, 2009, Journal of Applied Physics, 105, 013716.*

(Continued)

Primary Examiner—William J Klimowicz
(74) Attorney, Agent, or Firm—Brinks Hofer Gilson & Lione

(57) ABSTRACT

A magnetic sensing element is provided. A free magnetic layer has a three-layer structure including CoMnα sublayers each composed of a metal compound represented by the formula: $Co_{2x}Mn_x\alpha_y$. The α contains an element β and Sb, the element β being at least one element selected from Ge, Ga, In, Si, Pb, Zn, Sn, and Al. The concentration x and the concentration y are each represented in terms of atomic percent and satisfy the equation: $3x+y=100$ atomic percent. One of the CoMnα sublayers is in contact with a lower nonmagnetic material layer. The other CoMnα sublayer is in contact with upper nonmagnetic material layer. As a result, it is possible to achieve a high ΔRA and a lower interlayer coupling magnetic field Hin compared with the known art.

14 Claims, 5 Drawing Sheets

U.S. PATENT DOCUMENTS

| | | | |
|---|---|---|---|
| 2006/0227467 A1* | 10/2006 | Ide et al. | 360/324.11 |
| 2006/0268465 A1* | 11/2006 | Ide et al. | 360/313 |
| 2007/0115596 A1* | 5/2007 | Nakabayashi et al. | 360/324 |
| 2007/0230067 A1* | 10/2007 | Jogo et al. | 360/324.1 |
| 2007/0230070 A1* | 10/2007 | Mizuno et al. | 360/324.12 |

FOREIGN PATENT DOCUMENTS

| | | |
|---|---|---|
| JP | 2004-214251 | 7/2004 |
| JP | 2004-348850 | 12/2004 |
| JP | 2005-051251 | 2/2005 |
| JP | 2005-116701 | 4/2008 |

OTHER PUBLICATIONS

English Translation of Office Action issued in corresponding Japanese Patent Application No. 2005-242558; issued Mar. 3, 2009.

* cited by examiner

MAGNETIC SENSING ELEMENT INCLUDING FREE MAGNETIC LAYER OR PINNED MAGNETIC LAYER HAVING TWO SUBLAYERS THAT ARE COMPOSED OF DIFFERENT COMN-BASED HEUSLER ALLOYS

This application claims the benefit of Japanese Patent Application No. 2005-242558 filed on Aug. 24, 2005, which is hereby incorporated by reference.

BACKGROUND

1. Field a magnetic sensing element is provided.

2. Related Art

Japanese Unexamined Patent Application Publication Nos. 2003-218428, 2005-51251, 2004-348850, and 2004-214251 each disclose a current-perpendicular-to-plane-mode magnetic sensing element (CPP-mode magnetic sensing element) including a free magnetic layer composed of a Heusler alloy such as $Co_2MnGe$.

It has been known that the free magnetic layer composed of $Co_2MnGe$ increases the product $\Delta RA$ of the rate of change of magnetoresistance $\Delta R$ and an element area A. The increase in the product $\Delta RA$ is a significantly important requirement for the practical application of a CPP-mode magnetic sensing element having a higher recording density.

When the free magnetic layer is composed of $Co_2MnGe$, an interlayer coupling magnetic field Hin acting between the pinned magnetic layer and the free magnetic layer increased. Although a Ge concentration of about 25 atomic percent increased $\Delta RA$, the interlayer coupling magnetic field Hin also increased disadvantageously. Although a Ge content exceeding 25 atomic percent slightly reduced $\Delta RA$, the interlayer coupling magnetic field Hin increased steeply. The increase in interlayer coupling magnetic field Hin results in an increase in asymmetry. Thus, it is necessary to reduce the interlayer coupling magnetic field Hin.

The free magnetic layer composed of $Co_2MnGe$ has relatively high coercive force and magnetostriction. Thus, to improve the stability of the read characteristics, preferably, these magnetic properties are also minimized.

SUMMARY

A magnetic sensing element of a preferred embodiment includes a pinned magnetic layer, the magnetization direction of the pinned magnetic layer being fixed. A free magnetic layer is provided, the magnetization direction of the free magnetic layer varying in response to an external magnetic field. A nonmagnetic material layer is disposed between the pinned magnetic layer and the free magnetic layer, wherein at least one of the free magnetic layer and the pinned magnetic layer includes a CoMnα alloy sublayer composed of a metal compound represented by the following formula: $Co_{2x}Mn_x\alpha_y$. The α contains an element β and Sb, the element β being at least one element selected from Ge, Ga, In, Si, Pb, Zn, Sn, and Al. The concentration x and the concentration y are each represented in terms of atomic percent and satisfy the equation: $3x+y=100$ atomic percent, and the concentration y is in the range of 24 to 28 atomic percent. This achieves a high $\Delta RA$ and a low interlayer coupling magnetic field Hin. Thus, it is possible to improve the stability of read characteristics compared with the known art.

In a preferred embodiment, at least the free magnetic layer preferably includes the CoMnα alloy sublayer. This reduces the coercive force and the magnetostriction of the free magnetic layer, thereby more effectively improving the stability of the read characteristics.

In a preferred embodiment, α is expressed as $\beta_{1-z}Sb_z$ (wherein z represents an atomic ratio), z being preferably in the range of 0.1 to 0.9. This effectively achieves a high $\Delta RA$, a low interlayer coupling magnetic field Hin, and a low coercive force of the free magnetic layer. The z ranges from about 0.25 to about 0.75 more and effectively achieves a high $\Delta RA$, a low interlayer coupling magnetic field Hin, and a low coercive force of the free magnetic layer. The CoMnα alloy sublayer is preferably in contact with at least the nonmagnetic material layer in order to achieve a low interlayer coupling magnetic field Hin. The free magnetic layer preferably has a laminated structure including the CoMnα alloy sublayer and a CoMnβ alloy sublayer in order to achieve a higher $\Delta RA$.

At least one of the free magnetic layer and the pinned magnetic layer includes a CoMnα alloy sublayer composed of a metal compound represented by the following formula: $Co_{2x}Mn_x\alpha_y$, wherein α contains an element β and Sb, the element β being at least one element selected from Ge, Ga, In, Si, Pb, Zn, Sn, and Al; and the concentration x and the concentration y are each represented in terms of atomic percent and satisfy the equation: $3x+y=100$ atomic percent, and the concentration y is in the range of 24 to 28 atomic percent. This achieves a high $\Delta RA$ and a low interlayer coupling magnetic field Hin. Furthermore, the free magnetic layer including the CoMnα alloy sublayer reduces the coercive force and the magnetostriction of the free magnetic layer, thereby improving the stability of the read characteristics compared with the known art.

DRAWINGS

Figure 4:
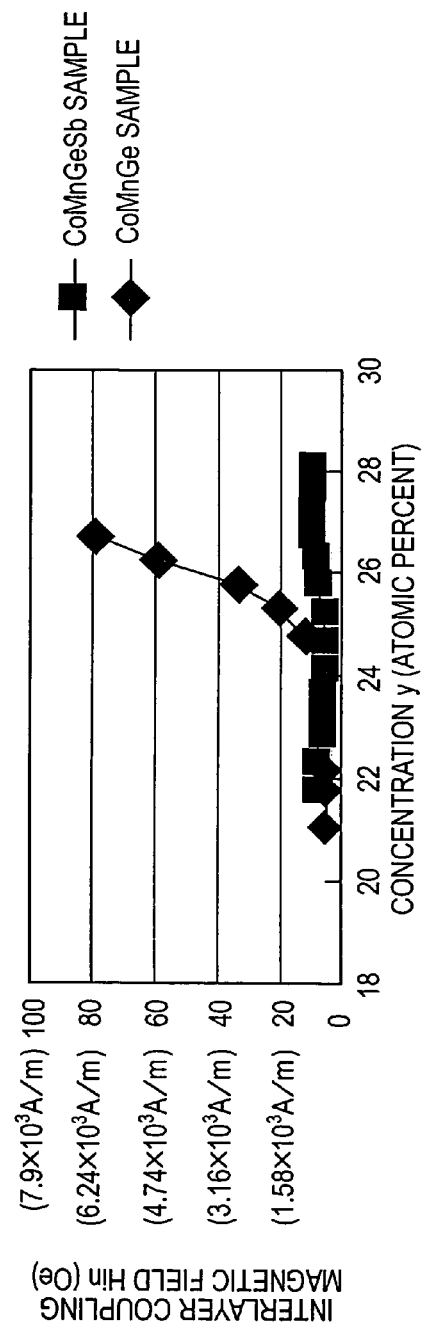
Figure 5:
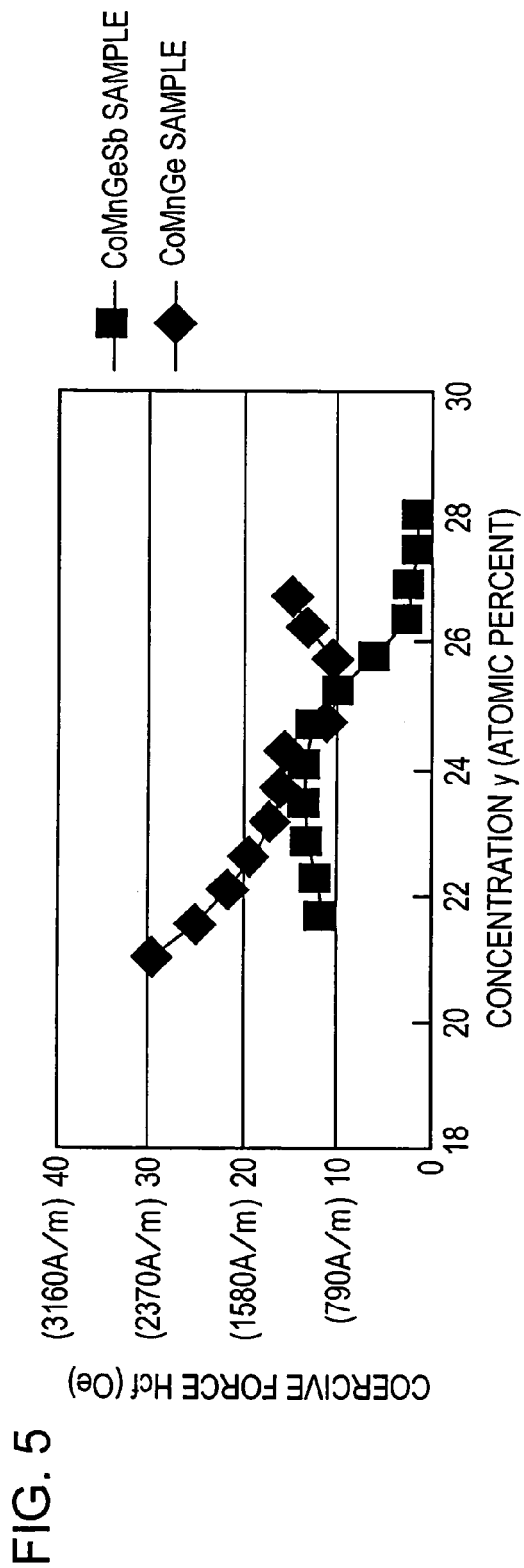
Figure 6:
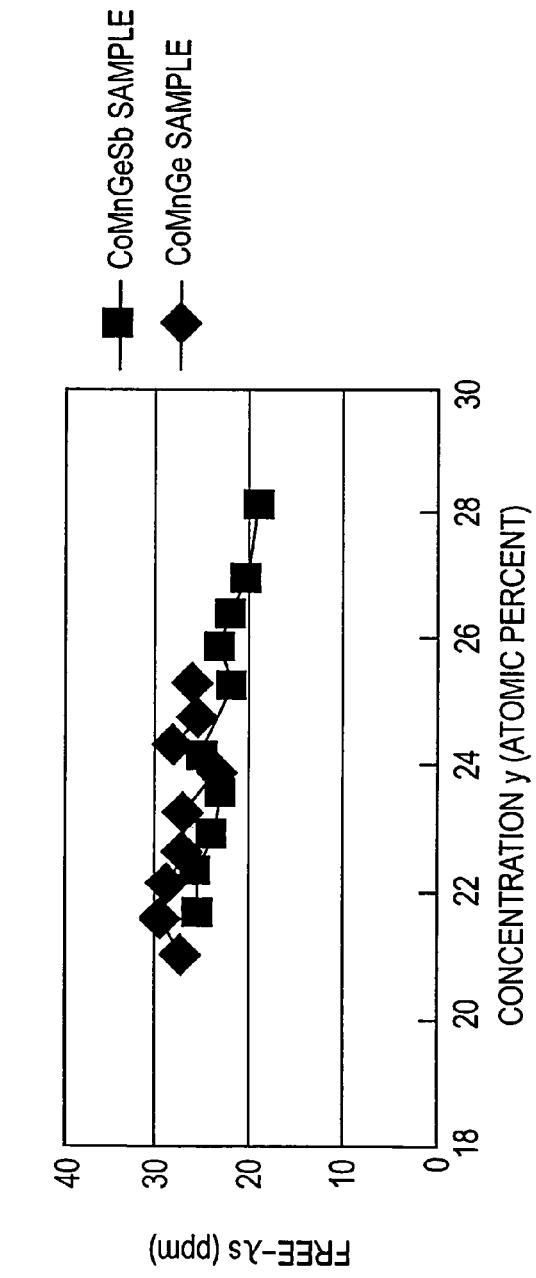
Figure 7:
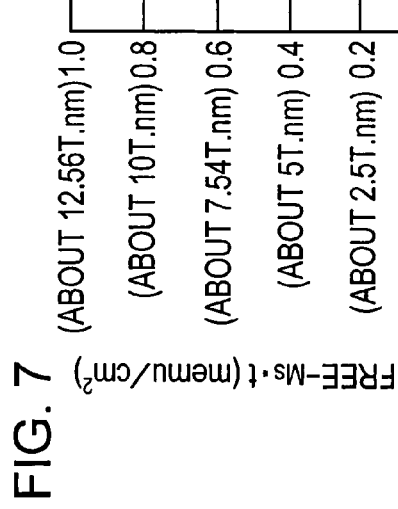
Figure 8:
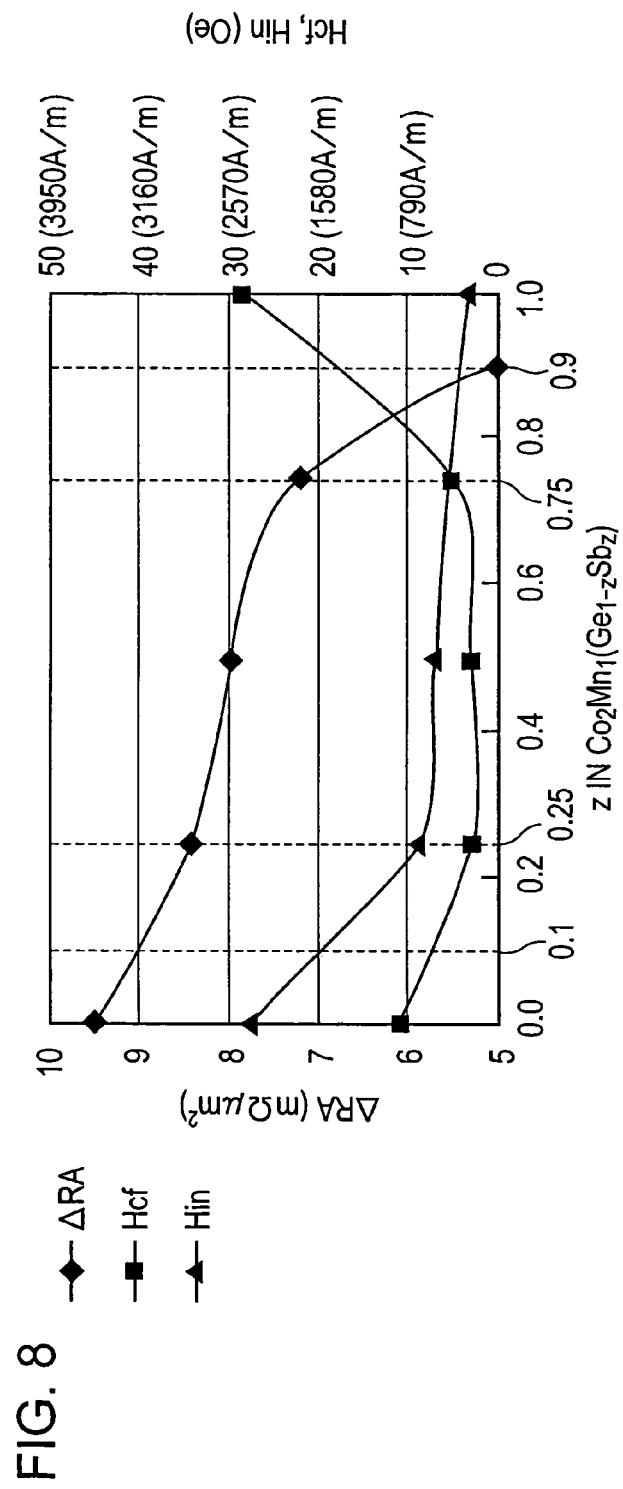

FIG. 4 is a graph that shows the relationship between the concentration y and the interlayer coupling magnetic field Hin in each of the CoMnGeSb sample and the CoMnGe sample, the CoMnGeSb sample having the free magnetic layer and the second magnetic sublayer each composed of $CO_{2x}Mn_x(Ge_{0.75}Sb_{0.25})_y$, and the CoMnGe sample having the free magnetic layer and the second magnetic sublayer each composed of $Co_{2x}Mn_xGe_y$;

FIG. 5 is a graph that shows the relationship between the concentration y and the coercive force of the free magnetic layer in each of the CoMnGeSb sample and the CoMnGe sample, the CoMnGeSb sample having the free magnetic layer and the second magnetic sublayer each composed of $CO_{2x}Mn_x(Ge_{0.75}Sb_{0.25})_y$, and the CoMnGe sample having the free magnetic layer and the second magnetic sublayer each composed of $Co_{2x}Mn_xGe_y$;

FIG. 6 is a graph that shows the relationship between the concentration y and the magnetostriction of the free magnetic layer in each of the CoMnGeSb sample and the CoMnGe sample, the CoMnGeSb sample having the free magnetic layer and the second magnetic sublayer each composed of $CO_{2x}Mn_x(Ge_{0.75}Sb_{0.25})_y$, and the CoMnGe sample having the free magnetic layer and the second magnetic sublayer each composed of $Co_{2x}Mn_xGe_y$;

FIG. 7 is a graph that shows the relationship between the concentration y and Ms·t of the free magnetic layer in each of the CoMnGeSb sample and the CoMnGe sample, the CoMnGeSb sample having the free magnetic layer and the second magnetic sublayer each composed of $CO_{2x}Mn_x(Ge_{0.75}Sb_{0.25})_y$, and the CoMnGe sample having the free magnetic layer and the second magnetic sublayer each composed of $Co_{2x}Mn_xGe_y$; and FIG. 8 is a graph showing the relationship between the atomic fraction z and ΔRA, the relationship between the atomic fraction z and the interlayer coupling magnetic field Hin, and the relationship between the atomic fraction z and the coercive force of the free magnetic layer in a sample having the free magnetic layer and the second magnetic sublayer each composed of $Co_2Mn_1(Ge_{1-z}Sb_z)_1$ (80).

DESCRIPTION OF THE PREFERRED EMBODIMENTS

Figure 1:
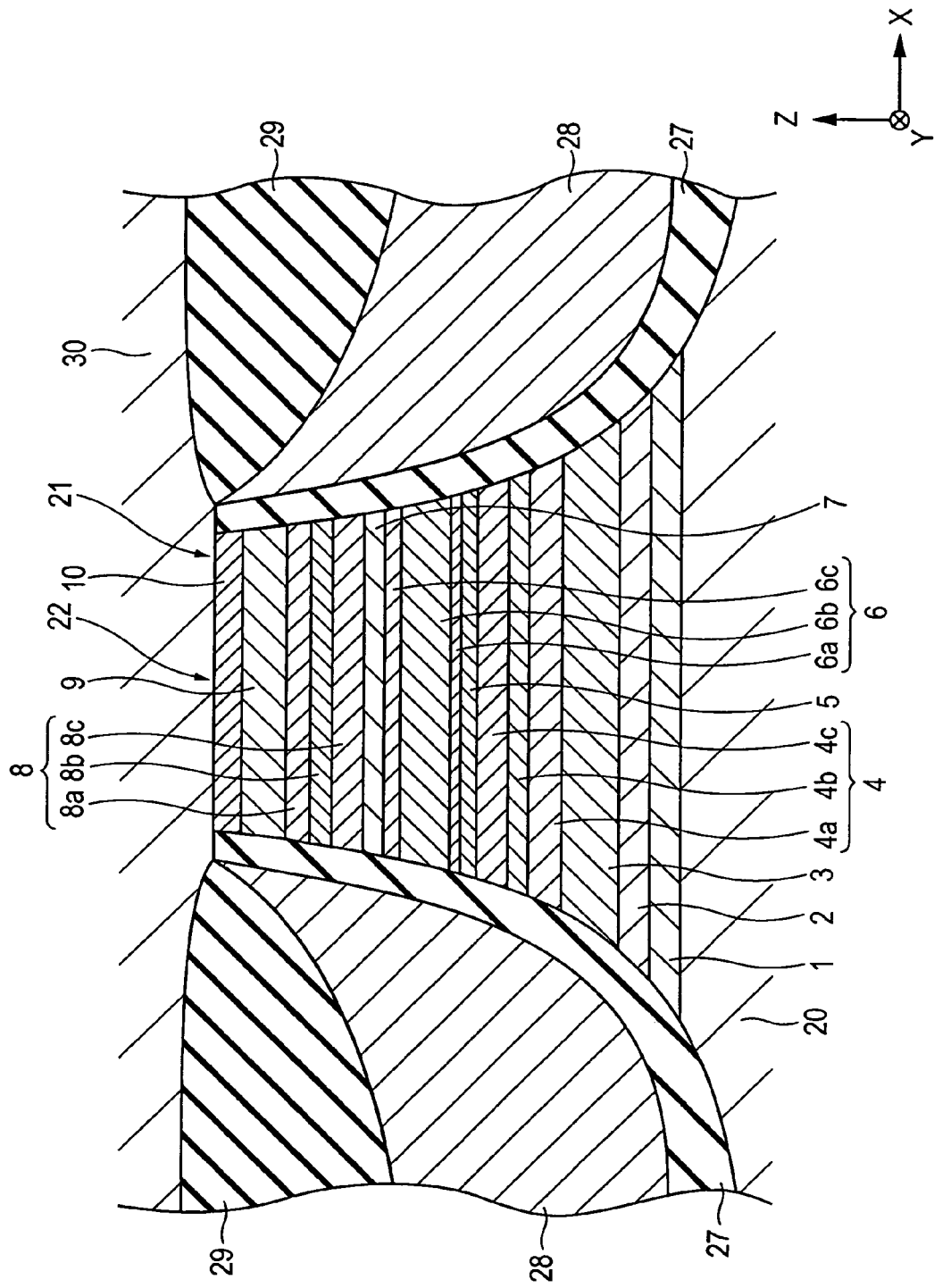
FIG. 1 is a fragmentary cross-sectional view of a CPP-mode dual spin-valve thin-film element (magnetic sensing element) according to a preferred embodiment, the view being taken along a plane parallel to a face that faces a recording medium.

FIG. 1 is a fragmentary cross-sectional view of a CPP-mode dual spin-valve thin-film element (magnetic sensing element) according to a preferred embodiment, the view being taken along a plane parallel to a face that faces a recording medium.

The dual spin-valve thin film element is disposed at a trailing end of a floating slider included in a hard disk system and detects a magnetic field recorded in a hard disk or the like. In each drawing, the X direction indicates a track width direction. The Y direction indicates the direction of a magnetic leakage field from a magnetic recording medium (height direction). The Z direction indicates the direction of motion of a magnetic recording medium such as a hard disk and also indicates the stacking direction of layers in the dual spin-valve thin-film element. The X, Y, and Z directions are at right angles to one another.

A dual spin-valve thin-film element 21 is disposed on a bottom shield layer 20 and has a laminate 22. The laminate 22 includes an underlying layer 1, a seed layer 2, a lower antiferromagnetic layer 3, a lower pinned magnetic layer 4, a lower nonmagnetic material layer 5, a free magnetic layer 6, an upper nonmagnetic material layer 7, an upper pinned magnetic layer 8, an upper antiferromagnetic layer 9, and a protective layer 10 in that order from the bottom.

The magnetization direction of the free magnetic layer 6 is aligned in the track width direction (X direction shown in the figure). The magnetization of each of the lower and upper pinned magnetic layers 4 and 8 is fixed in the direction parallel to the height direction (Y direction). In an embodiment shown in FIG. 1, each of the lower and upper pinned magnetic layers 4 and 8 has a laminated ferrimagnetic structure. The magnetization direction of a first lower magnetic sublayer 4a is antiparallel to that of a second lower magnetic sublayer 4c. The magnetization direction of a first upper magnetic sublayer 8a is antiparallel to that of a second upper magnetic sublayer 8c.

The laminate 22 has a substantially trapezoidal shape. The width of the laminate 22 in the track width direction (X direction) gradually decreases with height.

Insulating layers 27, hard bias layers 28, and insulating layers 29 are laminated in that order from the bottom at both sides of the laminate 22 in the track width direction. A top shield layer 30 is disposed over the insulating layers 29 and the protective layer 10. In the CPP-mode spin-valve thin-film element, the bottom shield layer 20 and the top shield layer 30 each function as an electrode. A current passes through the laminate 22 in the direction perpendicular to interfaces between the layers constituting the laminate 22 (i.e., in the direction parallel to the Z direction).

The material and the like of each layer will be described. The underlying layer 1 is composed of a nonmagnetic material containing, for example, at least one element selected from Ta, Hf, Nb, Zr, Ti, Mo, and W. The seed layer 2 is composed of NiFeCr or Cr. The seed layer 2 composed of NiFeCr and has a face-centered cubic (fcc) structure. Equivalent crystal planes each expressed as the {111} plane are dominantly oriented in the direction parallel to the surface of the seed layer. Alternatively, the seed layer 2 composed of Cr has a body-centered cubic (bcc) structure. Equivalent crystal planes each expressed as the {110} plane are dominantly oriented in the direction parallel to the surface of the seed layer.

The lower and upper antiferromagnetic layers 3 and 9 are each composed of an antiferromagnetic material containing an element X (wherein X represents at least one element selected from Pt, Pd, Ir, Rh, Ru, and Os) and Mn. Alternatively, the lower and upper antiferromagnetic layers 3 and 9 are each composed of an antiferromagnetic material containing the element X, an element X' (wherein X' represents at least one element selected from Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb, and rare-earth elements), and Mn.

The lower pinned magnetic layer 4 has a multilayer structure including the first lower magnetic sublayer 4a, a nonmagnetic intermediate sublayer 4b, and the second lower magnetic sublayer 4c, the first lower magnetic sublayer 4a being in contact with the lower antiferromagnetic layer 3, and the nonmagnetic intermediate sublayer 4b being in contact with the lower nonmagnetic material layer 5.

The upper pinned magnetic layer 8 has a multilayer structure including the first upper magnetic sublayer 8a, a nonmagnetic intermediate sublayer 8b, and the second upper magnetic sublayer 8c, the first upper magnetic sublayer 8a being in contact with the upper antiferromagnetic layer 9, and the second upper magnetic sublayer 8c being in contact with upper nonmagnetic material layer 7. Each of the lower and upper pinned magnetic layers 4 and 8 has a laminated ferrimagnetic structure. The first lower magnetic sublayer 4a and the first upper magnetic sublayer 8a are each composed of a ferromagnetic material such as CoFe, NiFe, or CoFeNi. The nonmagnetic intermediate sublayer 4b and the nonmagnetic intermediate sublayer 8b are each composed of a nonmagnetic conductive material, for example, Ru, Rh, Ir, Cr, Re, or Cu. Materials and structures of the second lower magnetic sublayer 4c and the second upper magnetic sublayer 8c will be described below. The lower and upper nonmagnetic material layers 5 and 7 are each composed of Cu, Au, or Ag.

The material and the structure of the free magnetic layer 6 will be described. The insulating layers 27 and 29 are each composed of an insulating material, for example, $Al_2O_3$ or $SiO_2$. The hard bias layers 28 are each composed of, for example, a cobalt-platinum (Co—Pt) alloy or a cobalt-chromium-platinum (Co—Cr—Pt) alloy.

Features of the spin-valve thin-film element shown in FIG. 1 will be described.

In the spin-valve thin-film element shown in FIG. 1, the free magnetic layer 6 has a three-layer structure including a CoMnα alloy sublayer 6a and a CoMnα alloy sublayer 6c. The CoMnα alloy sublayers 6a and 6c are each composed of a metal compound represented by the formula: $Co_{2x}Mn_x\alpha_y$ (wherein α contains an element β and Sb, the element β being at least one element selected from Ge, Ga, In, Si, Pb, Zn, Sn, and Al; and the concentration x and the concentration y are each represented in terms of atomic percent and satisfy the equation: $3x+y=100$ atomic percent). The CoMnα alloy sublayer 6a is in contact with the lower nonmagnetic material layer 5. The CoMnα alloy sublayer 6c is in contact with the upper nonmagnetic material layer 7.

As described above, α contains the element β and Sb. Each of the CoMnα alloy sublayers 6a and 6c is formed of at least a quaternary system. In this embodiment, the concentration of α, for example, y, is in the range of 24 to 28 atomic percent.

When the free magnetic layer 6 is formed of a single layer composed of a CoMnGe alloy (Co:Mn:Ge=2:1:1), the product ΔRA of the rate of change of magnetoresistance ΔR and the element area A is high. The interlayer coupling magnetic field Hin acting between the pinned magnetic layers 4 and 8 and the free magnetic layer 6 is disadvantageously high. The interlayer coupling magnetic field Hin is increased at a Ge concentration of 25 atomic percent or higher. It is believed that this is because elemental Ge increases and is then deposited at the interface between the lower nonmagnetic material layer 5 and the upper nonmagnetic material layer 7.

In this preferred embodiment, the CoMnα alloy sublayers 6a and 6c are each formed of the quaternary system containing Co, Mn, element β, for example, Ge, and Sb, the CoMnα alloy sublayer 6a being in contact with the lower nonmagnetic material layer 5, the CoMnα alloy sublayer 6c being contact with the upper nonmagnetic material layer 7, and the concentration of α, for example, y, being in the range of 24 to 28 atomic percent. This achieves a high ΔRA and a lower interlayer coupling magnetic field Hin, as compared with the known structure in which the free magnetic layer is formed of a single layer composed of a CoMnGe alloy. The free magnetic layer 6 has a lower coercive force and a lower magnetostriction, as compared with the known free magnetic layer formed of a single layer composed of a CoMnGe alloy.

The concentration of α, for example, y, ranging from 26 to 28 atomic percent more effectively achieves a high ΔRA and a lower coercive force of the free magnetic layer 6 and is thus preferable.

In this preferred embodiment, α is expressed as $\beta_{1-z}Sb_z$ (wherein z represents an atomic ratio), and z is preferably in the range of about 0.1 to about 0.9, thereby effectively achieving a high ΔRA, a low interlayer coupling magnetic field Hin, and a low coercive force of the free magnetic layer 6. More preferably, z is in the range of about 0.25 to about 0.75, thereby more effectively a high ΔRA, a low interlayer coupling magnetic field Hin, and a low coercive force of the free magnetic layer 6. Therefore, it is possible to improve the stability of the read characteristics, for example, it is possible to suppress an increase in asymmetry, as compared with the known art.

In the embodiment shown in FIG. 1, the free magnetic layer 6 does not have such a single layer structure composed of the CoMnα alloy but includes a CoMnβ alloy sublayer 6b (wherein β represents at least one element selected from Ge, Ga, In, Si, Pb, Zn, Sn, and Al) disposed between the CoMnα alloy sublayers 6a and 6c. The free magnetic layer 6 having the single-layer structure composed of the CoMnα alloy achieves a high ΔRA and a lower interlayer coupling magnetic field Hin compared with the known art. However, the free magnetic layer 6 including the CoMnβ alloy sublayer 6b achieves a higher ΔRA and is thus preferable.

For example, the CoMnα alloy sublayers 6a and 6c are each composed of $Co_2Mn_1Ge_{0.75}Sb_{0.25}$. The CoMnβ alloy sublayer 6b is composed of $Co_2Mn_1Ge_1$. An experimental described below showed that the CoMnβ alloy sublayer composed of a CoMnGe alloy or the like increased ΔRA. Furthermore, the CoMnα alloy sublayers 6a and 6c each composed of a CoMnGeSb alloy or the like are in contact with the lower and upper nonmagnetic material layers 5 and 7, respectively, the lower and upper nonmagnetic material layers 5 and 7 being believed to have the most effect on the interlayer coupling magnetic field Hin. For example, the free magnetic layer 6 has the laminated structure including the CoMnα alloy sublayers 6a and 6c and the CoMnβ alloy sublayer 6b, thereby achieving a high ΔRA and a low interlayer coupling magnetic field Hin. The CoMnβ alloy sublayer 6b preferably has an atomic ratio of Co:Mn:β of 2:1:1.

For example, a secondary ion mass spectrometer (SIMS) and a nanobeam energy-dispersive x-ray diffraction with a field emission-type transmission electron microscope (FE-TEM) are applied to composition analysis. Heat treatment of the CoMnα alloy sublayers 6a and 6c and the CoMnβ alloy sublayer 6b diffuses the elements. Thus, the concentration of α, the concentration of Sb, and the like are preferably measured near the interfaces between the CoMnα alloy sublayer 6a and the lower nonmagnetic material layer 5 and between the CoMnα alloy sublayer 6c and the upper nonmagnetic material layer 7 because areas near the interfaces are less affected by the diffusion.

An experiment described below showed, for example, that even when the second lower magnetic sublayer 4c constituting the lower pinned magnetic layer 4 and the second upper magnetic sublayer 8c constituting the upper pinned magnetic layer 8 each had a single-layer structure composed of the CoMnα alloy, a high ΔRA and a low interlayer coupling magnetic field Hin were achieved.

To further improve ΔRA, the following structure is used: for example, the second lower magnetic sublayer 4c and the second upper magnetic sublayer 8c each have a single-layer structure composed of the CoMnβ alloy. The second lower magnetic sublayer 4c has a laminated structure including a CoMnα alloy subsublayer and a CoMnβ alloy subsublayer, the CoMnα alloy subsublayer being in contact with the lower nonmagnetic material layer 5, and the CoMnβ alloy subsublayer being in contact with the nonmagnetic intermediate sublayer 4b, and the second upper magnetic sublayer 8c has a laminated structure including a CoMnα alloy subsublayer and a CoMnβ alloy subsublayer, the CoMnα alloy subsublayer being in contact with the upper nonmagnetic material layer 7, and the CoMnβ alloy subsublayer being in contact with the nonmagnetic intermediate sublayer 8b.

The second lower magnetic sublayer 4c has a laminated structure including a CoMnα alloy subsublayer and a ferromagnetic material subsublayer composed of NiFe, CoFeNi, CoFe, or the like, the CoMnα alloy subsublayer being in contact with the lower nonmagnetic material layer 5, and the ferromagnetic material subsublayer being in contact with the nonmagnetic intermediate sublayer 4b, and the second upper magnetic sublayer 8c has a laminated structure including a CoMnα alloy subsublayer and a ferromagnetic material subsublayer composed of, for example, NiFe, CoFeNi, or CoFe, the CoMnα alloy subsublayer being in contact with the upper nonmagnetic material layer 7, and the ferromagnetic material subsublayer being in contact with the nonmagnetic intermediate sublayer 8b.

The second lower magnetic sublayer 4c has a laminated structure including a CoMnα alloy subsublayer, a ferromagnetic material subsublayer composed of, for example, NiFe, CoFeNi, or CoFe, and a CoMnβ alloy subsublayer, the CoMnα alloy subsublayer being in contact with the lower nonmagnetic material layer 5, the ferromagnetic material subsublayer being in contact with the nonmagnetic intermediate sublayer 4b, and the CoMnβ alloy subsublayer being disposed between the CoMnα alloy subsublayer and the ferromagnetic material subsublayer, and the second upper magnetic sublayer 8c has a laminated structure including a CoMnα alloy subsublayer, ferromagnetic material subsublayer composed of, for example, NiFe, CoFeNi, or CoFe, and a CoMnβ alloy subsublayer, the CoMnα alloy subsublayer being in contact with the upper nonmagnetic material layer 7, the ferromagnetic material subsublayer being in contact with the nonmagnetic intermediate sublayer 8b, and the CoMnβ alloy subsublayer being disposed between the CoMnα alloy subsublayer and the ferromagnetic material subsublayer.

In the second lower magnetic sublayer 4c and the second upper magnetic sublayer 8c each having the laminated structure including the ferromagnetic material subsublayer composed of, for example, NiFe, CoFeNi, or CoFe, each ferromagnetic material subsublayer being in contact with the nonmagnetic intermediate sublayer 4b or the nonmagnetic intermediate sublayer 8b, the Ruderman-Kittel-Kasuya-Yosida (RKKY) interactions between the first lower magnetic sublayer 4a and the second lower magnetic sublayer 4c and between the first upper magnetic sublayer 8a and the second upper magnetic sublayer 8c is strong, thus strongly fixing the magnetization directions of the first lower magnetic sublayer 4a, the first upper magnetic sublayer 8a, the second lower magnetic sublayer 4c, and the second upper magnetic sublayer 8c.

Figure 2:
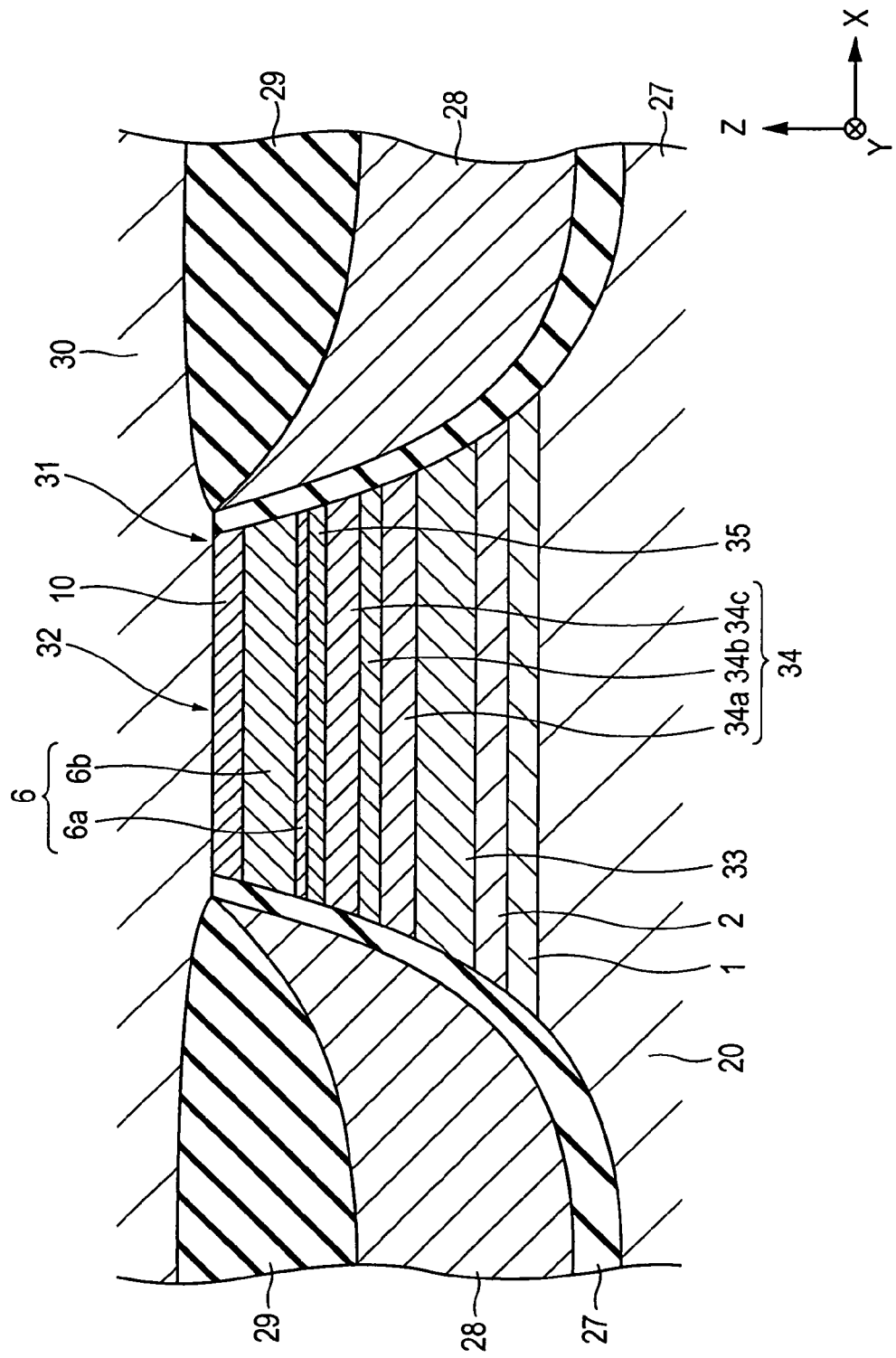
FIG. 2 is a fragmentary cross-sectional view of a CPP-mode single spin-valve thin-film element (magnetic sensing element) according to a preferred embodiment the view being taken along a plane parallel to a face that faces a recording medium.

FIG. 2 is a fragmentary cross-sectional view of a CPP-mode single spin-valve thin-film element (magnetic sensing element), the view being taken along a plane parallel to a face that faces a recording medium.

A single spin-valve thin-film element 31 shown in FIG. 2 is disposed between the bottom shield layer 20 and the top shield layer 30. The single spin-valve thin-film element 31 has a laminate 32 including the underlying layer 1, the seed layer 2, an antiferromagnetic layer 33, a pinned magnetic layer 34, a nonmagnetic material layer 35, the free magnetic layer 6, and the protective layer 10 in that order from the bottom. These layers are each composed of the same material as that described in FIG. 1.

In the single spin-valve thin-film element 31 shown in FIG. 2, the free magnetic layer 6 consists of the CoMnα alloy sublayer 6a and the CoMnβ alloy sublayer 6b, the CoMnα alloy sublayer 6a being in contact with the nonmagnetic material layer 35 and being composed of a metal compound represented by the following formula: $Co_{2x}Mn_x\alpha_y$ (wherein α contains an element β and Sb, the element β being at least one element selected from Ge, Ga, In, Si, Pb, Zn, Sn, and Al; and the concentration x and the concentration y are each represented in terms of atomic percent and satisfy the equation: 3x+y=100 atomic percent).

As described above, α contains β and Sb. Thus, the CoMnα alloy sublayer 6a is formed of at least a quaternary system. The concentration of α, for example, y, is in the range of 24 to 28 atomic percent.

In this embodiment, the CoMnα alloy sublayer 6a is formed of the quaternary system containing Co, Mn, element β for example, Ge, and Sb, the CoMnα alloy sublayer 6a being in contact with the nonmagnetic material layer 35. This achieves a high ΔRA and a lower interlayer coupling magnetic field Hin, as compared with the known structure in which the free magnetic layer is formed of a single layer composed of a CoMnGe alloy. The free magnetic layer 6 has a lower coercive force and a lower magnetostriction, as compared with the known free magnetic layer formed of a single layer composed of a CoMnGe alloy.

In this preferred embodiment, α is expressed as $\beta_{1-z}Sb_z$ (wherein z represents an atomic ratio), and z is preferably in the range of 0.1 to 0.9, thereby effectively achieving a high ΔRA, a low interlayer coupling magnetic field Hin, and a low coercive force of the free magnetic layer 6. More preferably, z is in the range of about 0.25 to about 0.75, thereby more effectively a high ΔRA, a low interlayer coupling magnetic field Hin, and a low coercive force of the free magnetic layer 6.

A process that produces the dual spin-valve thin-film element 21 shown in FIG. 1 will be described. The underlying layer 1, the seed layer 2, the lower antiferromagnetic layer 3, the lower pinned magnetic layer 4, the lower nonmagnetic material layer 5, the free magnetic layer 6, the upper nonmagnetic material layer 7, the upper pinned magnetic layer 8, the upper antiferromagnetic layer 9, and the protective layer 10 are formed by sputtering or evaporation. With respect to materials for the layers, refer to the descriptions in FIG. 1.

As shown in FIG. 1, the free magnetic layer 6 has a three-layer structure. The CoMnα alloy sublayer 6a is formed on the lower nonmagnetic material layer 5 by sputtering or evaporation, the CoMnα alloy sublayer 6a being composed of a metal compound represented by the formula: $Co_{2x}Mn_x\alpha_y$ (wherein α contains an element β and Sb, the element β being at least one element selected from Ge, Ga, In, Si, Pb, Zn, Sn, and Al; and the concentration x and the concentration y are each represented in terms of atomic percent and satisfy the equation: 3x+y=100 atomic percent). The concentration of α, for example, y, is set in the range of about 24 to about 28 atomic percent. Preferably, z in $\beta_{1-z}Sb_z$ (wherein z represents an atomic ratio) is set in the range of about 0.1 to about 0.9. More preferably, z is set in the range of about 0.25 to about 0.75. For example, the CoMnα alloy sublayer 6a is formed of $Co_2Mn_1Ge_{0.75}Sb_{0.25}$.

The CoMnβ alloy sublayer 6b is formed on the CoMnα alloy sublayer 6a by sputtering or evaporation. For example, the CoMnβ alloy sublayer 6b is formed of $Co_2Mn_1Ge_1$.

The CoMnα alloy sublayer 6c is formed on the CoMnβ alloy sublayer 6b by sputtering or evaporation. For example, the CoMnα alloy sublayer 6c is formed of $Co_2Mn_1Ge_{0.75}Sb_{0.25}$ in the same way as the CoMnα alloy sublayer 6a.

After the formation of the stack of the underlying layer 1 to protective layer 10, the stack are subjected to heat treatment at, for example, 290° C. for about 3.5 hours to generate exchange coupling magnetic fields between the lower antiferromagnetic layer 3 and the first lower magnetic sublayer 4a constituting the lower pinned magnetic layer 4 and between the upper antiferromagnetic layer 9 and the first upper magnetic sublayer 8a constituting the upper pinned magnetic layer 8. As a result, the first lower magnetic sublayer 4a and the first upper magnetic sublayer 8a are each magnetized in the direction parallel to the height direction (Y direction). The RKKY interactions act between the first lower magnetic sublayer 4a and the second lower magnetic sublayer 4c and between the first upper magnetic sublayer 8a and the second upper magnetic sublayer 8c. Therefore, the second lower magnetic sublayer 4c is magnetized in the direction antiparallel to the magnetization direction of the first lower magnetic sublayer 4a, and the second upper magnetic sublayer 8c is magnetized in the direction antiparallel to the magnetization direction of the first upper magnetic sublayer 8a.

The heat treatment described above is believed to cause the diffusion of the elements in the CoMnα alloy sublayer 6a, the CoMnα alloy sublayer 6c, and the CoMnβ alloy sublayer 6b, these layers constituting the free magnetic layer 6. The existence of the CoMnα alloy sublayer 6a is verified by analyzing the composition near the interface between the free magnetic layer 6 and the lower nonmagnetic material layer 5. The existence of the CoMnα alloy sublayer 6c is verified by analyzing the composition near the interface between the free magnetic layer 6 and the upper nonmagnetic material layer 7. The existence of the CoMnβ alloy sublayer 6b is verified by analyzing the composition in the middle of the free magnetic layer 6.

After the laminate 22 is formed into a shape shown in the figure, the insulating layers 27, the hard bias layers 28, and the insulating layers 29 are formed at both sides of the laminate 22 in the track width direction (X direction) by sputtering or evaporation. The hard bias layers 28 are polarized in the X direction to align the magnetization direction of the free magnetic layer 6 in the X direction.

The single spin-valve thin-film element 31 shown in FIG. 2 can be formed by the same production process as that of the dual spin-valve thin-film element 21 shown in FIG. 1.

EXAMPLES

A dual spin-valve thin-film element having a layer structure described below was produced.

A basic layer structure was as follows: underlying layer 1 composed of Ta (30)/seed layer 2 composed of NiFeCr (50)/lower antiferromagnetic layer 3 composed of IrMn (70)/lower pinned magnetic layer 4 [first lower magnetic sublayer 4a composed of $Fe_{30at\%}Co_{70at\%}$ (30)/nonmagnetic intermediate sublayer 4b composed of Ru (9.1)/second lower magnetic sublayer 4c]/lower nonmagnetic material layer 5 composed of Cu (50)/free magnetic layer 6/upper nonmagnetic material layer 7 composed of Cu (50)/upper pinned magnetic layer 8 [second upper magnetic sublayer 8c/nonmagnetic intermediate sublayer 8b composed of Ru (9.1)/first upper magnetic sublayer 8a composed of $Fe_{40at\%}Co_{60at\%}$ (30)]/upper antiferromagnetic layer 9 composed of IrMn (70)/protective layer 10 composed of Ta (200). Numbers in parentheses represent thicknesses. The unit of each thickness is Å.

In this experiment, the free magnetic layer 6 was composed of $Co_{2x}Mn_x(Ge_{0.75}Sb_{0.25})_y$ (80) (wherein 3x+y=100 atomic percent).

The second lower magnetic sublayer 4c was composed of $\{Fe_{40at\%}Co_{60at\%}\ (10)/Co_{2x}Mn_x(Ge_{0.75}Sb_{0.25})_y\ (40)\}$, and the second upper magnetic sublayer 8c was composed of $\{Co_{2x}Mn_x(Ge_{0.75}Sb_{0.25})_y\ (40)/Fe_{40at\%}Co_{60at\%}\ (10)\}$ (wherein 3x+y=100 atomic percent).

Magnetic sensing elements having different concentrations y (atomic percent) of $(Ge_{0.75}Sb_{0.25})$ were produced and subjected to heat treatment.

Hereinafter, the above-described spin-valve thin-film element is referred to as a "CoMnGeSb sample" named after the composition of the free magnetic layer.

A dual spin-valve thin-film element having the basic layer structure was produced, the free magnetic layer 6 being composed of a CoMnGe alloy. The free magnetic layer 6 was composed of $Co_{2x}Mn_xGe_y$ (80) (wherein 3x+y=100 atomic percent).

The second lower magnetic sublayer 4c was composed of $\{Fe_{40at\%}Co_{60at\%}\ (10)/Co_{2x}Mn_xGe_y\ (40)\}$, and the second upper magnetic sublayer 8c was composed of $\{Co_{2x}Mn_xGe_y\ (40)/Fe_{40at\%}Co_{60at\%}\ (10)\}$ (wherein 3x+y=100 atomic percent).

Magnetic sensing elements having different Ge concentrations y (atomic percent) were produced and subjected to heat treatment.

The above-described spin-valve thin-film element is referred to as a "CoMnGe sample" named after the composition of the free magnetic layer.

Figure 3:
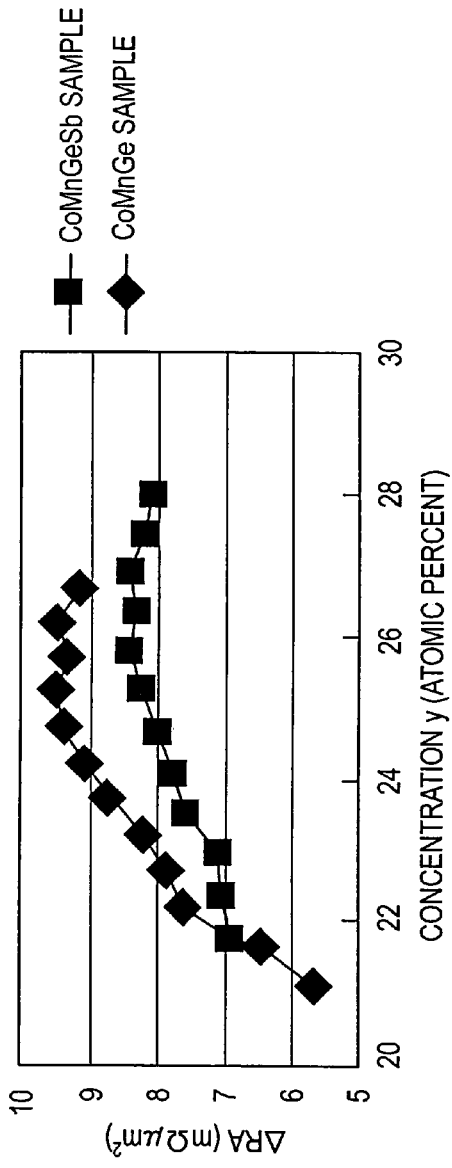
FIG. 3 is a graph that shows the relationship between the concentration y and $\Delta RA$ in each of a CoMnGeSb sample and a CoMnGe sample, the CoMnGeSb sample having a free magnetic layer and a second magnetic sublayer each composed of $CO_{2x}Mn_x(Ge_{0.75}Sb_{0.25})_y$, and the CoMnGe sample having a free magnetic layer and a second magnetic sublayer each composed of $Co_{2x}Mn_xGe_y$.

In this experiment, the relationship between the concentration y and ΔRA was investigated. FIG. 3 shows the results.

As shown in FIG. 3, it was found that ΔRA increased with increasing concentration y in each of the CoMnGeSb sample and the CoMnGe sample. In the CoMnGe sample, it was found that when the concentration y was about 25 atomic percent, for example, when the composition was $Co_2Mn_1Ge_1$, ΔRA was maximized. In the CoMnGeSb sample, it was found that when the concentration y was about 26 atomic percent, ΔRA was maximized. Furthermore, in the CoMnGeSb sample, it was also found that even when the concentration y was increased to about 28 atomic percent, a high ΔRA was maintained at a substantially constant level.

The relationship between the concentration y and the interlayer coupling magnetic field Hin was investigated. FIG. 4 shows the results. As shown in FIG. 4, in the CoMnGe sample, it was found that when the concentration y was 25 atomic percent or higher, the interlayer coupling magnetic field Hin increased steeply. In contrast, in the CoMnGeSb sample, it was found that when the concentration y changed, the interlayer coupling magnetic field Hin changed little and was maintained at a significantly low level.

The relationship between the concentration y and the coercive force of the free magnetic layer was investigated. FIG. 5 shows the results. As shown in FIG. 5, in the CoMnGe sample, it was found that when the concentration y changed, the coercive force of the CoMnGe sample increased significantly, as compared with the CoMnGeSb sample. The minimum coercive force of the CoMnGe sample was 10 Oe or higher (about 790 A/m or higher). In the CoMnGeSb sample, it was found that, in particular, when the concentration y was 25 atomic percent or higher, the coercive force was less than 10 Oe (about less than 790 A/m). Furthermore, it was also found that the concentration y was 26 atomic percent or higher, the coercive force was surely less than 10 Oe.

The relationship between the concentration y and the magnetostriction of the free magnetic layer was investigated. As shown in FIG. 6, it was found that the magnetostriction of the CoMnGe sample was about 25 to 30 ppm. It was also found that the magnetostriction of the CoMnGeSb sample was suppressed to be 25 ppm or lower as long as the concentration y was in the range of 22 to 28 atomic percent.

The relationship between the concentration y and the product of the saturation magnetization Ms and the thickness t (Ms·t) of the free magnetic layer was investigated. As shown in FIG. 7, the value of Ms·t of the CoMnGeSb sample was about 10% lower than that of the CoMnGe sample. However, the CoMnGeSb sample and the CoMnGe sample had substantially the same Ms·t.

On the basis of the experimental results on the CoMnGeSb sample, the concentration y, which was the total concentration of Ge and Sb, was set in the range of 24 to 28 atomic percent. As a result, it was found that ΔRA could be set at 7 mΩμm² or higher, the interlayer coupling magnetic field Hin could be set at a significantly low level (specifically, 15 Oe or lower (about 1,185 A/m or lower)), the coercive force of the free magnetic layer could be set at 15 Oe or lower (about 1,185 A/m or lower), and the magnetostriction of the free magnetic layer could be suppressed to be 25 ppm or lower.

More preferably, when the concentration y was set at 26 atomic percent or higher, ΔRA could be set at 8 mΩμm² or higher while the interlayer coupling magnetic field Hin was maintained at a low level. Furthermore, the coercive force of the free magnetic layer could be set at 10 Oe or lower (about 790 A/m or lower).

A dual spin-valve thin-film element having a layer structure described below was produced.

A basic layer structure was as follows: underlying layer 1 composed of Ta (30)/seed layer 2 composed of NiFeCr (50)/ lower antiferromagnetic layer 3 composed of IrMn (70)/ lower pinned magnetic layer 4 [first lower magnetic sublayer 4a composed of $Fe_{30at\%}Co_{70at\%}$ (30)/nonmagnetic intermediate sublayer 4b composed of Ru (9.1)/second lower magnetic sublayer 4c]/lower nonmagnetic material layer 5 composed of Cu (50)/free magnetic layer 6/upper nonmagnetic material layer 7 composed of Cu (50)/upper pinned magnetic layer 8 [second upper magnetic sublayer 8c/nonmagnetic intermediate sublayer 8b composed of Ru (9.1)/first upper magnetic sublayer 8a composed of $Fe_{40at\%}Co_{60at\%}$ (30)]/ upper antiferromagnetic layer 9 composed of IrMn (70)/protective layer 10 composed of Ta (200). Numbers in parentheses represent thicknesses. The unit of each thickness is Å.

In this experiment, the free magnetic layer 6 was composed of $Co_2Mn_1(Ge_{1-z}Sb_z)_1$ (80).

The second lower magnetic sublayer 4c was composed of $\{Fe_{40at\%}Co_{60at\%}$ (10)/$Co_2Mn_1$ $(Ge_{1-z}Sb_z)_1$ (40)$\}$. The second upper magnetic sublayer 8c was composed of $\{Co_2Mn_1$ $(Ge_{1-z}Sb_z)_1$ (40)/$Fe_{40at\%}Co_{60at\%}$ (10)$\}$.

Magnetic sensing elements having different atomic ratio z were produced and subjected to heat treatment.

In this experiment, the relationships between the atomic ratio z and ΔRA, between the atomic ratio z and the interlayer coupling magnetic field Hin, and between the atomic ratio z and the coercive force of the free magnetic layer were investigated. FIG. 8 shows the results.

As shown in FIG. 8, it was found that when the atomic ratio z increased, in other words, when the Sb concentration with respect to the Ge concentration increased, ΔRA decreased. It was also found that the interlayer coupling magnetic field Hin decreased with increasing atomic ratio z. Furthermore, it was found that when the atomic ratio z was increased to about 0.75 or less, the coercive force of the free magnetic layer was maintained at a low level, and when the atomic ratio z exceeded 0.75, the coercive force gradually increased.

On the basis of the experimental results shown in FIG. 8, the atomic ratio z was set in the range of 0.1 to 0.9. As a result, it was found that ΔRA could be set at 5 mΩμm² or higher and each of the interlayer coupling magnetic field Hin and the coercive force of the free magnetic layer could be set at 20 Oe or lower (about 1,580 A/m or lower).

From the experimental results shown in FIG. 8, it was found that the atomic ratio z was more preferably set in the range of 0.25 to 0.75. As a result, it was found that ΔRA could be set at 7 mΩμm² or higher and each of the interlayer coupling magnetic field Hin and the coercive force of the free magnetic layer could be set at 10 Oe or lower (about 790 A/m or lower).

It was also found that when the atomic ratio z was set in the range of 0.25 to 0.5, ΔRA could be set at 8 mΩμm² or higher.

What is claimed is:

1. A magnetic sensing element comprising:
    a pinned magnetic layer;
    a free magnetic layer; and
    a nonmagnetic material layer disposed between the pinned magnetic layer and the free magnetic layer,
    wherein at least one of the free magnetic layer and the pinned magnetic layer includes a CoMnα alloy,
    wherein α contains an element β and Sb (where the element β is at least one element selected from Ge, Ga, In, Si, Pb, Zn, Sn, and Al),
    wherein the CoMnα alloy comprising a metal compound is represented by the following formula: $Co_{2x}Mn_xα_y$, and
    wherein the concentration x and the concentration y are each represented in terms of atomic percent and satisfy the equation: 3x+y=100 atomic percent, and the concentration y is in the range of about 24 to about 28 atomic percent.

2. The magnetic sensing element according to claim 1, wherein at least the free magnetic layer includes the CoMnα alloy.

3. The magnetic sensing element according to claim 1, wherein α is expressed as $β_{1-z}Sb_z$ (wherein z represents an atomic ratio and is in the range of about 0.1 to about 0.9).

4. The magnetic sensing element according to claim 3, wherein z is in the range of about 0.25 to about 0.75.

5. The magnetic sensing element according to claim 1, wherein the CoMnα alloy is in contact with at least the nonmagnetic material layer.

6. The magnetic sensing element according to claim 1, wherein the free magnetic layer has a laminated structure including the CoMnα alloy and a CoMnβ alloy (wherein β represents at least one element selected from Ge, Ga, In, Si, Pb, Zn, Sn, and Al).

7. The magnetic sensing element according to claim 1, wherein the magnetization direction of the pinned magnetic layer is fixed.

8. The magnetic sensing element according to claim 1, wherein the magnetization direction of the free magnetic layer varies in response to an external magnetic field.

9. A magnetic sensing element comprising:
    a pinned magnetic layer, the magnetization direction of the pinned magnetic layer being fixed;
    a free magnetic layer, the magnetization direction of the free magnetic layer varies in response to an external magnetic field; and
    a nonmagnetic material layer disposed between the pinned magnetic layer and the free magnetic layer,
    wherein at least one of the free magnetic layer and the pinned magnetic layer includes a CoMnα alloy sublayer composed of a metal compound represented by the following formula: $Co_{2x}Mn_xα_y$,
    wherein α contains an element β and Sb, the element β being at least one element selected from Ge, Ga, In, Si, Pb, Zn, Sn, and Al; and the concentration x and the concentration y are each represented in terms of atomic percent and satisfy the equation: 3x+y=100 atomic percent, and the concentration y is in the range of about 24 to about 28 atomic percent.

10. The magnetic sensing element according to claim 9, wherein at least the free magnetic layer includes the CoMnα alloy sublayer.

11. The magnetic sensing element according to claim 9, wherein α is expressed as $β_{1-z}Sb_z$ (wherein z represents an atomic ratio and is in the range of about 0.1 to about 0.9).

12. The magnetic sensing element according to claim 11, wherein z is in the range of about 0.25 to about 0.75.

13. The magnetic sensing element according to claim 9, wherein the CoMnα alloy sublayer is in contact with at least the nonmagnetic material layer.

14. The magnetic sensing element according to claim 9, wherein the free magnetic layer has a laminated structure including the CoMnα alloy sublayer and a CoMnβ alloy sublayer (wherein β represents at least one element selected from Ge, Ga, In, Si, Pb, Zn, Sn, and Al).

* * * * *